United States Patent [19]
Lockman et al.

[11] Patent Number: 5,492,482
[45] Date of Patent: Feb. 20, 1996

[54] COMPACT THERMOCOUPLE CONNECTOR

[75] Inventors: Mark E. Lockman, Everett; Monte R. Washburn, Bothell; Howard T. Voorheis, Everett; Warren H. Wong, Seattle, all of Wash.

[73] Assignee: Fluke Corporation, Everett, Wash.

[21] Appl. No.: 255,133

[22] Filed: Jun. 7, 1994

[51] Int. Cl.⁶ .................................................. H01L 35/10
[52] U.S. Cl. .......................... 439/329; 136/235; 439/913
[58] Field of Search ...................................... 439/487, 913, 439/817, 329; 136/235

[56] References Cited

U.S. PATENT DOCUMENTS

| | | | |
|---|---|---|---|
| 3,543,215 | 11/1970 | Jones | 439/82 |
| 3,688,248 | 8/1972 | Modrey | 439/853 |
| 3,777,221 | 12/1973 | Tatusko et al. | 361/761 |
| 4,776,706 | 10/1988 | Loiterman et al. | 136/235 |
| 5,090,918 | 2/1992 | Zoellick et al. | 439/487 |

Primary Examiner—Neil Abrams

[57] ABSTRACT

A compact isothermal connector for a thermocouple temperature measurement system has electrical contacts with thermal mass sufficiently larger than the thermal mass of the corresponding contacts of a corresponding thermocouple connector to provide for improved settling times and measurement accuracy. The contacts are thermally coupled to a multi-layer printed circuit board containing layers of embedded thermally conducting material to achieve sufficient thermal coupling between the contacts. The contacts have sufficient thermal mass to achieve a desired settling time. A temperature sensor is thermally coupled to the printed circuit board and to each electrical contact to sense the temperature of the isothermal connector and provide the temperature information to a temperature measuring instrument to correct for measurement errors from the connector junction voltage.

4 Claims, 5 Drawing Sheets

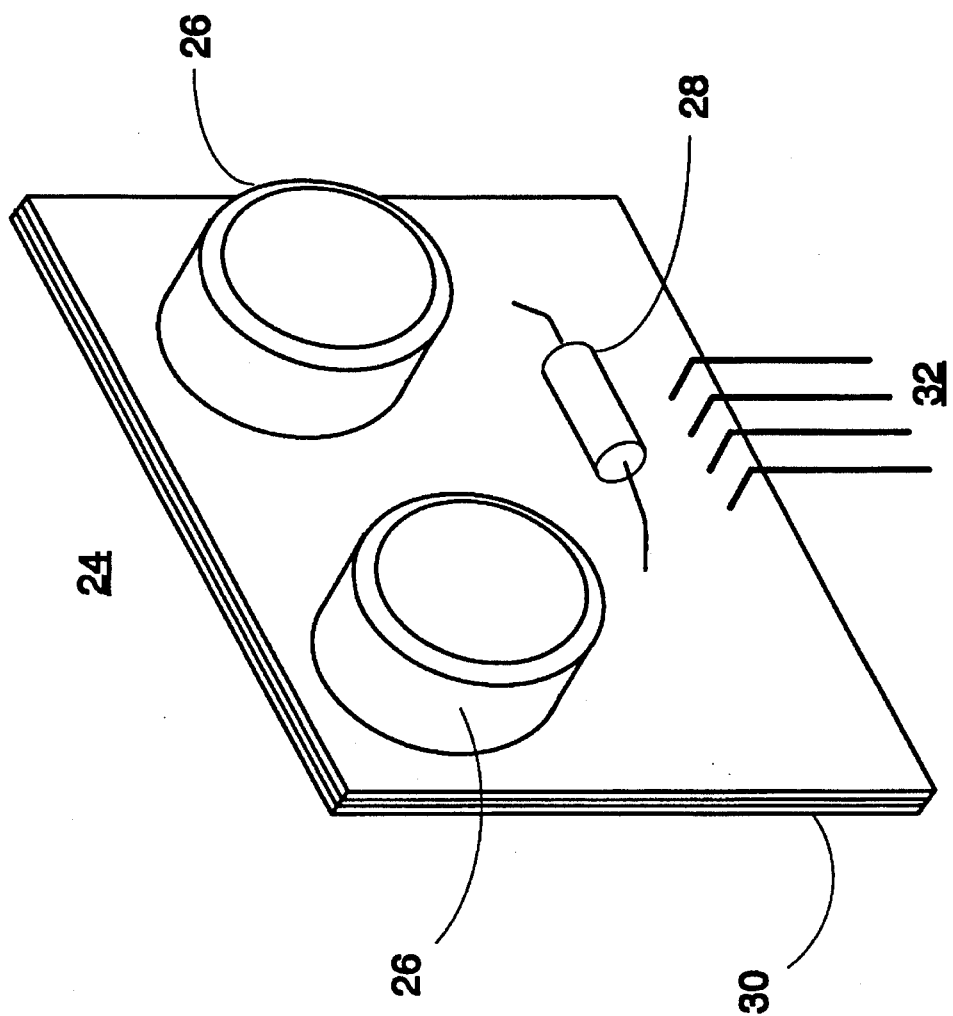

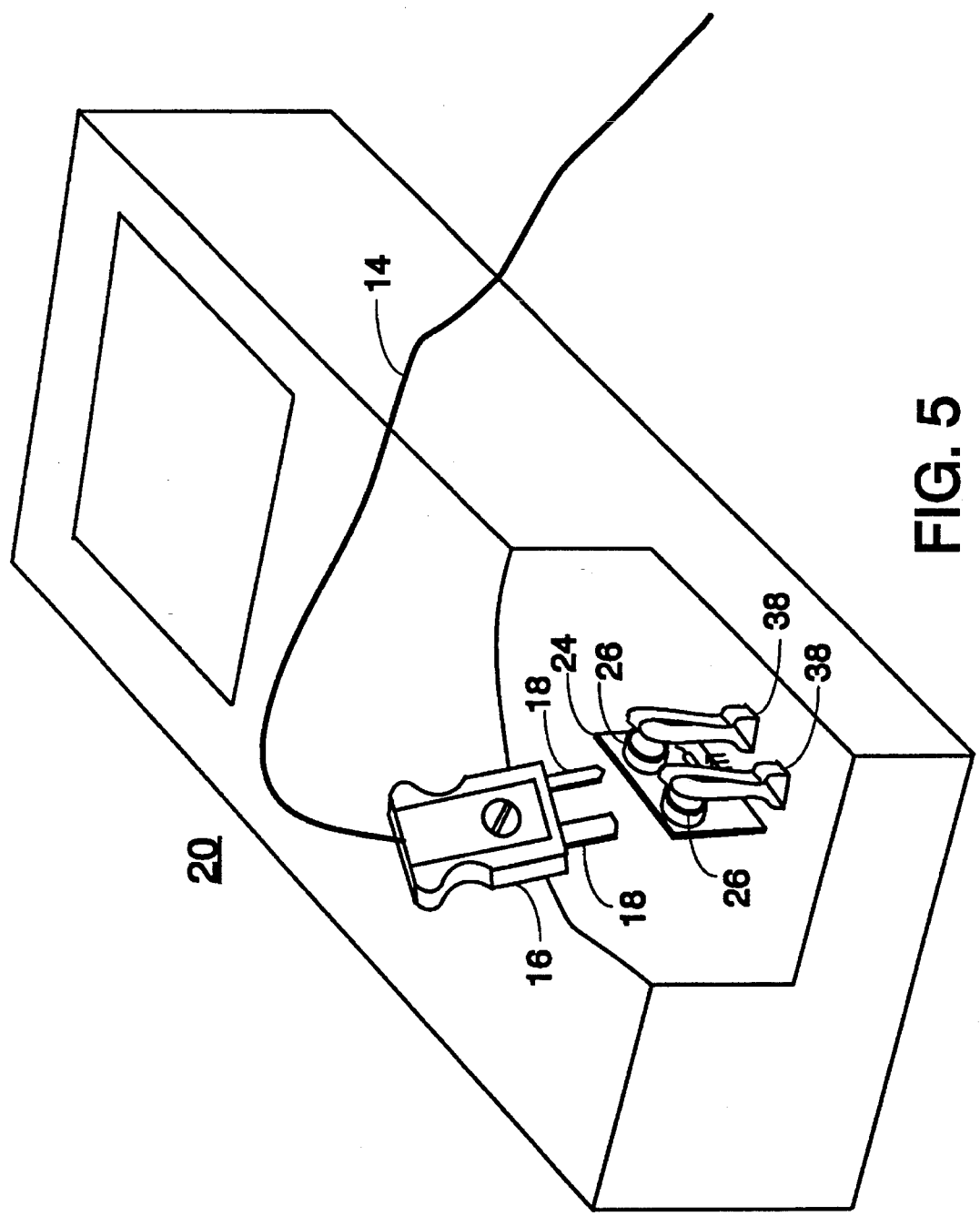

COMPACT THERMOCOUPLE CONNECTOR

BACKGROUND OF THE INVENTION

This invention relates generally to devices for electrical connectors and, particularly, to isothermal connectors for thermocouple temperature measurement calibration systems.

Thermocouples have been used for many years to make accurate temperature measurements. A thermocouple consists of a junction of two dissimilar metals with wire leads connected to each half of the junction. The thermocouple generates a thermoelectric voltage that is a function of the junction temperature and the choice of the particular metals which form the junction. Because the thermoelectric voltage generated a function of temperature can be determined for particular thermocouple junction, a voltage-measuring instrument can be used to measure the junction voltage and convert the voltage measurement into corresponding temperature information through a simple voltage to temperature conversion algorithm. A variety of different metals for use in the thermocouple junction have been employed to cream different types of thermocouples to suit the requirements of different measurement tasks. Typical selection parameters for thermocouple types include the anticipated temperature range of the measurement application and the required measurement accuracy. "J-type" and "K-type" thermocouples are examples of commonly available thermocouples which have well known characteristics in the industry for temperature range and accuracy. Temperature measurement instruments that utilize thermocouple probes will commonly accept J-type and K-type thermocouples and provide proper conversion of the measured junction voltage into a temperature reading according to IEC 584 and NIST (National Institute of Standards and Technology) temperature/voltage tables.

The thermocouple may be connected directly to a measuring instrument, making the task of measuring the thermocouple junction voltage straightforward. More commonly, however, the thermocouple is connected indirectly to the measuring instrument via thermocouple extension wires and a thermocouple connector which plugs into a corresponding connector on the measuring instrument in order to accommodate the rapid connection of different thermocouple probes to the measuring instrument. A blade-type thermocouple connector with metal contacts of a specified type and dimension has been standardized in the industry.

Thermocouple connectors have an undesirable side effect. The metal-to-metal contact between the connector of the thermocouple and corresponding contact in the instrument connector forms another junction of dissimilar metals which contributes its own thermoelectric voltage to the measurement, thus making it necessary to take further steps to counteract the error voltage contributed to the measurement. One strategy is to measure the temperature of the connector junction in order to estimate and remove its thermoelectric voltage contribution from the measurement.

The temperature of the connector junction may be measured by a temperature sensor that is typically, but not necessarily, located near the connector. To ensure accurate temperature readings by the instrument, it is important to minimize any temperature differences between the two contacts of the connector which form two separate junctions, one for each wire that is connected to the thermocouple. Furthermore, it is important to minimize the temperature difference between the temperature sensor and the connector-to-connector junctions. A temperature difference between the two contacts of the connector, or between the temperature sensor and the contacts, results in measurement errors which degrade the overall accuracy of the temperature measurement and cause the temperature measuring instrument to make erroneous temperature readings. Therefore, it is desirable that a thermocouple connector be "isothermal" in that the temperature between the two contacts and between the contacts and the temperature sensor is maintained at substantially the same temperature.

U.S. Pat. No. 5,090,918 "Isothermal Termination Block Having A Multi-Layer Thermal Conductor" to Zoellick et. al, and assigned to Fluke Corporation, discloses an isothermal termination block that facilitates the connection of a plurality of thermocouple wire leads to a set of associated wire terminals. The isothermal termination block achieves improved thermal coupling between each pair of terminals and also between the terminals and a local temperature sensor mounted on the terminal block through the use of a multi-layer printed circuit board with embedded layers of thermal conducting material, allowing improved thermal conductivity in a substantially smaller physical size compared to prior art, among other advantages. However, this solution, while solving the problem of maintaining an isothermal relationship between the wire terminals and the local temperature sensor in a semi-permanent installation, does not address a concern regarding the settling time required for a stable measurement after the connection and re-connection of different thermocouple connectors.

Furthermore, instrument connectors are typically smaller in size than terminal blocks. Zoellick et at. does not address the problem of maintaining temperature stability in a small physical size. The particular problem of small physical size in instrument thermocouple connectors is illustrated in the common situation where a thermocouple connector of one temperature is inserted into an instrument connector of another temperature. Thermal mass is a measure of the amount of thermal energy an object is capable of storing. Settling time is the minimum amount of time required for the temperatures of the two metal-to-metal junctions that form between the two connectors to stabilize and equalize to a degree that is sufficient for the desired measurement accuracy. The problem is exacerbated by the fact that a blade-type thermocouple connector is polarized by making one pin larger than the other in order to prevent insertion of the thermocouple connector in reverse polarity into the instrument connector. Because the two pins are different sizes, the volume of metal between the pins necessarily differs and therefore the thermal mass of the pins differs, resulting in degraded measurement accuracy and longer settling times because the two junctions approach an equilibrium temperature at different rates. Prior art thermocouple connectors were not designed for isothermal operation nor optimized for settling time after connection.

Increasing the thermal mass of the electrical contact, allows the contact to more rapidly equalize its temperature with that of another contact of a different temperature of a lesser thermal mass when the two contacts are thermally coupled with each other. The greater the ratio of the thermal mass of one contact to the other, the lesser the amount of settling time required for the temperatures to equalize. Increased thermal mass of the contact also allows greater stability in the face of short-term variations in the ambient air temperature. Thus, it would therefore be desirable to provide a compact isothermal instrument connector with increased thermal mass that offers a reduced amount of settling time, increased measurement accuracy, and reduced susceptibility to changes in ambient temperature.

SUMMARY OF THE INVENTION

In accordance with the present invention, an isothermal connector for thermocouple measurement systems is provided that permits the insertion of a blade-type thermocouple connector with a substantial reduction in settling time and improvement in overall temperature stability in a measurement system. A pair of electrical contacts of an isothermal connector are electrically and thermally coupled to a corresponding pair of contacts of a blade-type thermocouple connector as it is inserted and held against the pair of contacts by a pair of spring clips.

The isothermal nature of the isothermal connector is achieved through the use of the multi-layer circuit board containing embedded thermal conducting layers disclosed by Zoellick et al. as the thermally conductive member. The electrical contacts are rigidly mounted to the multi-layer circuit board to obtain both electrical and thermal contact with the multi-layer circuit board. A temperature sensor, in the form of a thermistor, is also thermally coupled to the multi-layer circuit board to provide sensing of the temperature of the electrical contacts.

The improved settling time is achieved by making the electrical contacts of a size and composition as to have a thermal mass substantially greater than the thermal mass of the corresponding set of contacts of the thermocouple to provide for improved settling time by proportionately reducing the contribution of the difference in thermal mass between the two pins. Furthermore, the substantial amount of thermal coupling between the contacts combined with their high thermal mass allows for higher measurement accuracy while maintaining an isothermal connector physically small in size because the metal-to-metal junctions are more thermally stable over changes in ambient temperature.

An alternative embodiment of the present invention provides for a pair of contacts thermally and electrically coupled to a ceramic substrate which provides thermal coupling between the contacts to maintain an isothermal condition. Furthermore, the ceramic substrate forms a substantial part of the thermal mass required for a desired settling time.

Therefore, one feature of the present invention is to provide a compact isothermal connector.

Another feature of the present invention is to provide an isothermal connector with substantially improved settling time after insertion of a thermocouple connector.

A further feature of the present invention is to provide an isothermal connector with improved accuracy while maintaining small physical size.

An additional feature of the present invention is to provide an isothermal connector with substantially improved temperature stability and capable of supporting higher measurement accuracy.

Other features, attainments, and advantages will become apparent to those skilled in the art upon a reading of the following description when taken in conjunction with the accompanying drawings.

BRIEF DESCRIPTION OF THE DRAWINGS

FIG. 3 is a detailed illustration of a proposed commercial embodiment of the present invention;

FIG. 5 is an isometric view of the proposed commercial embodiment of the present invention in a temperature measuring instrument.

DETAILED DESCRIPTION OF THE INVENTION

Figures 1A, 1B:
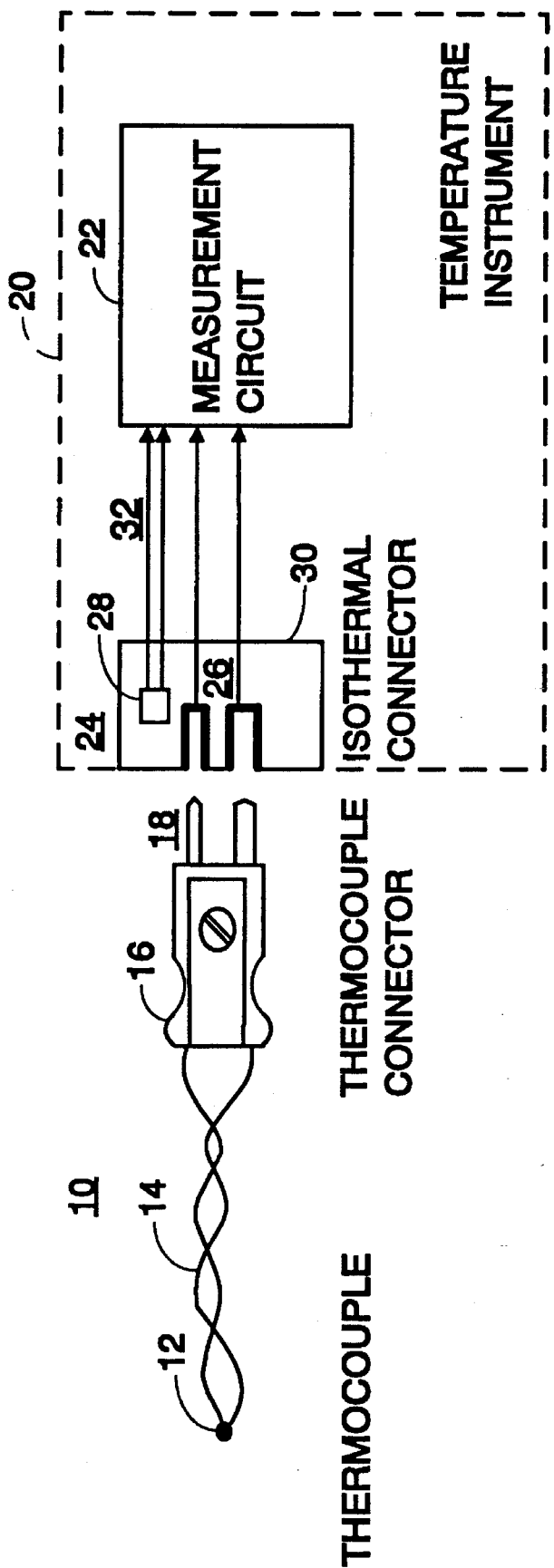
FIG. 1A is an illustration of a typical thermocouple bead probe and thermocouple connector according to the prior art.
FIG. 1B is a simplified block diagram of a temperature measurement instrument incorporating an isothermal connector configured to measure thermocouple voltages according to the prior art.

Referring now to FIG. 1A, there is shown a thermocouple temperature probe 10 according to the prior art comprised of a thermocouple 12, connecting leads 14, and a thermocouple connector 16. The temperature probe 10, illustrated here as a bead air probe, alternatively may consist of any of a variety of thermocouple probe types including immersion probes, piercing probes, and surface probes, all of which employ the thermocouple 12 as its sensing element. The thermocouple 12, comprised of a junction of two dissimilar metals which generates a d.c. (direct current) thermoelectric voltage as a function of its junction temperature, is coupled to the thermocouple connector 16 via the connecting leads 14. A common feature of the various probe configurations is the thermocouple connector 16 which is standardized in the industry as a blade-type connector allowing ease of connection. Thermocouple connector 16 is polarized, meaning it is designed to be inserted in only one direction in a corresponding connector by making the relative physical dimensions of a pair of corresponding contacts 18 substantially unequal, to maintain a desired polarity of the thermoelectric voltage generated by the thermocouple 12 to subsequent connections.

Referring now to FIG. 1B, there is shown a simplified block diagram of a temperature instrument 20 which includes a temperature measurement circuit 22 and an isothermal connector 24 according to the prior art. Isothermal connector 24 consists of a thermally conductive member 30 in the form of a multi-layer printed circuit board, a pair of electrical contacts 26 which are thermally coupled to the thermally conductive member 30, and a temperature sensor 28 also thermally coupled to the thermally conductive member 30. The multi-layer printed circuit board provides a high degree of thermal conductivity through embedded layers of thermally conductive material to facilitate an isothermal condition between the electrical contacts 26 and the temperature sensor 28, meaning the temperature differences between each of the electrical contacts 26 and also between the electrical contacts 26 and the temperature sensor 28 are maintained at substantially the same temperature. At the same time, the multi-layer printed circuit board functions as an electrical insulator between each of the electrical contacts 26 and the temperature sensor 28. Each of the electrical contacts 26 is electrically coupled to an input of the measurement circuit 22 via wires 32. The wires 32 may consist of embedded electrical traces within the multilayer printed circuit board, insulated wires, or some combination thereof involving like metals whose junctions do not induce thermal voltages. The signal from the temperature sensor 28 is also coupled via the wires 32 to an input of a measurement circuit 22. The temperature sensor 28 can be any type of temperature sensitive element, such as a thermistor, a diode, sensitive element, such as a thermistor, a diode, or a transistor whose base-emitter junction voltage is proportional to the transistor ambient temperature.

The measurement circuit 22 receives the thermoelectric voltage generated by the thermocouple 12 via the thermocouple connector 16 and isothermal connector 24. Thermocouple connector 24 functions as the corresponding connector to isothermal connector 24 in that the two connectors mate in the desired fashion with the proper connectors made between the corresponding contacts of each connector. The metal-to-metal contact between the electrical contacts 26 and each of the corresponding contacts 18 form two junctions which create two additional sources of thermoelectric voltage that contribute to the thermoelectric voltage sensed by the measurement circuit 22. Minimizing the error contributed by the connector junction voltages involves two strategies. First, the connector junctions must be maintained at the same temperature, that is, in an isothermal manner, to minimize the differential contribution of the two connector junction voltages to the desired thermoelectric voltage of the thermocouple 12. Furthermore, the measurement circuit, by measuring the output signal of the temperature sensor 28 can account for the connector junction voltages. The temperature sensed by the temperature sensor 28 must substantially reflect the actual temperature of the electrical contacts 26 in order to accurately account for the error contribution of each contact to the desired thermoelectric voltage of the thermocouple 12. This first strategy of maintaining an isothermal condition is a static technique in that it assumes that all relevant temperatures are at an equilibrium condition.

The second strategy to reduce the error induced by connector junction voltages involves the improvement of the dynamic performance capability of the isothermal connector which is constrained to a relatively small mount of physical space. The electrical contacts 26 of the isothermal connector 24 are chosen in such a manner that their thermal mass relative to the thermal mass of the corresponding contacts 18 is sufficient to permit a desired settling time. Settling time is the amount of time required for temperature differences between each of the electrical contacts 26 and the corresponding contacts 18 to equalize and reach a steady temperature value after the connector 16 is inserted into isothermal connector 24. The amount of thermal mass in each of the electrical contacts 26 was arrived at empirically by varying the volume of Tellurium copper material that forms the contact. For example, a thermal mass ratio of five to one was empirically arrived at in development of a proposed commercial embodiment in order to allow an acceptably short sealing time after insertion of the connector 16 into the isothermal connector 24. Tellurium copper, an alloy well known in the art, was chosen as the contact material because of its superior ability to resist corrosion while providing adequate thermal mass per unit volume to maintain the compact size of the isothermal connector 24.

Figures 2A, 2B:
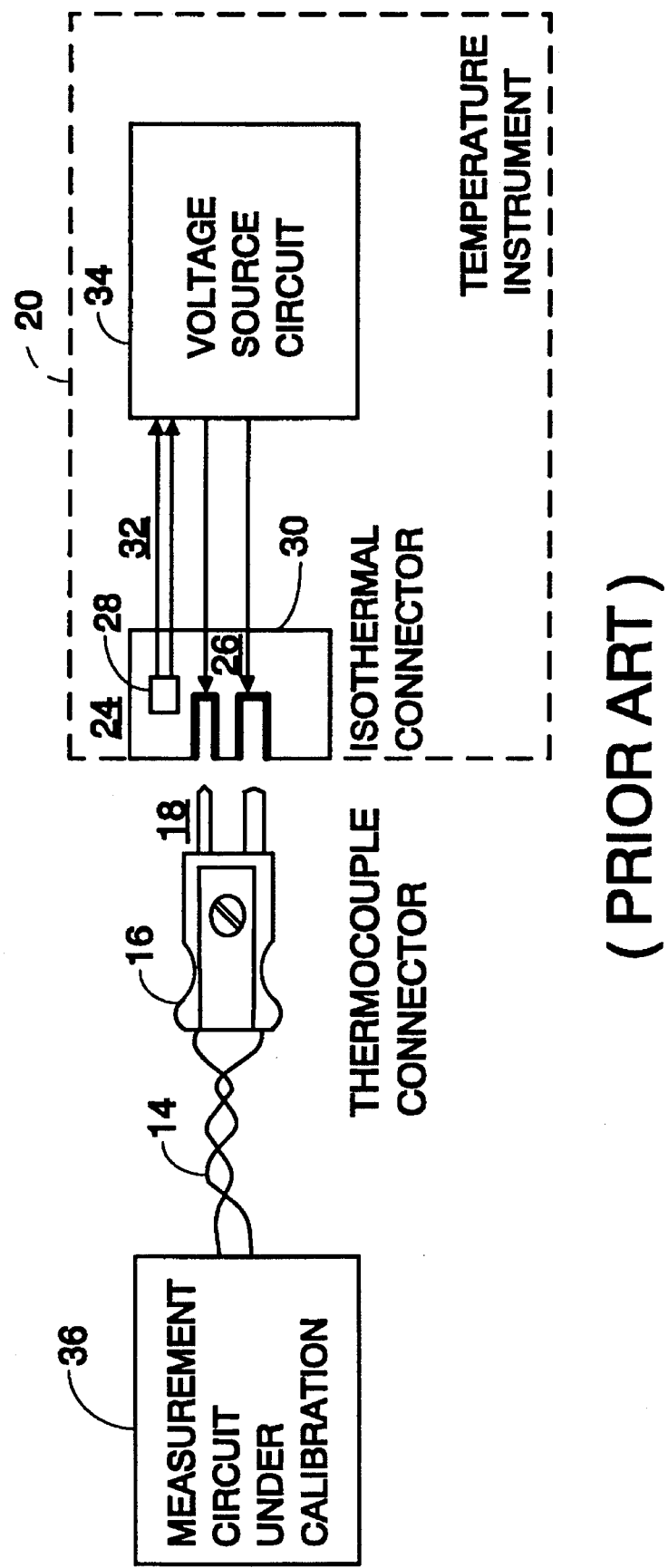
FIG. 2A is an illustration of a measurement instrument to be calibrated which is coupled to a thermocouple connector according to the prior art.
FIG. 2B is a simplified block diagram of a temperature measurement instrument incorporating an isothermal connector configured to simulate thermocouple voltages for calibrating a measurement instrument according to the prior art.

Referring now to FIG. 2A, there is shown a measurement circuit 36 which is coupled to the thermocouple connector 16 via the wires 14. Measurement circuit 36 represents an application in which temperature measurement instruments can be calibrated. By substituting a thermocouple 12 with a known temperature-compensated signal, the measurement circuit 36 is then adjusted to provide the desired response to the known signal and thereby calibrated. Calibration of a measurement circuit 36 requires a simulation of the signals provided by thermocouples to an accuracy that exceeds that of the measurement circuit 36, making the contributed error of the thermoelectric voltage from any connector junctions in the circuit more critical to control and account for.

FIG. 2B is a simplified block diagram of the temperature instrument 20 according to the prior art now comprising the isothermal connector 24 and a voltage source circuit 34 which performs a complementary function to that of the measurement circuit 22 of FIG. 1B by accurately simulating a thermoelectric junction voltage of a particular thermocouple type set to a predetermined temperature. The simulated voltage is coupled from an output of the voltage source circuit 34 to the electrical contacts 26. The temperature sensor 28 senses the temperature of the electrical contacts 26 and the signal from temperature sensor 28 is coupled via the wires 32 to an input of the voltage source circuit 34 which reads the signal and generates a responsive amount of compensation voltage to the simulated voltage provided to the electrical contacts 26 to correct for contributed errors from the connector junction voltages developed between the contacts 18 and 26. The error contribution of the connector junctions function in precisely the same manner as explained for the circuit in FIG. 1B and the requirements of accuracy and settling time are similar. In the preferred embodiment, the voltage source circuit 36 or measurement circuit 22 are selectably connected to the isothermal connector 24 in the temperature instrument 20, allowing the temperature instrument 20 to fulfill its intended role in maintaining thermocouple temperature measurement systems by allowing a user to verify the operation of the thermocouple 12 and to calibrate the measurement circuit 36. The requirements of the isothermal connector are identical for either measuring a thermocouple or in simulating a thermocouple because the thermoelectric voltages of the connector junctions contribute to measurement error regardless of the signal direction.

FIG. 3 illustrates the preferred embodiment of the present invention. Isothermal connector 24 is comprised of the electrical contacts 26, temperature sensor 28, thermally conductive member 30 and the wires 32. The electrical contacts 26 are thermally coupled to the thermally conductive member 30 which is in the form of a multi-layer printed circuit board and further electrically coupled to the measurement circuit 22 or to the voltage source circuit 34 via the wires 32. Thermally conductive member 30 provides a substantial amount of thermal coupling between each of electrical contacts 26 and between the electrical contacts 26 and the temperature sensor 28 to provide an isothermal condition. To achieve further isolation from other sources of thermal energy, thermally conductive member 30 is maintained physically small to facilitate separation from thermal contact with disruptive thermal sources within the temperature instrument 20. The thermal mass necessary to achieve the desired settling time and temperature stability resides in the electrical contacts 26. The temperature sensor 28 is comprised of a thermistor which is thermally coupled to the electrical contacts 26 via the thermally conductive member 30. Temperature sensor 28 may be comprised of a thermistor or a semiconductor junction formed by a transistor or a diode.

Figure 4:
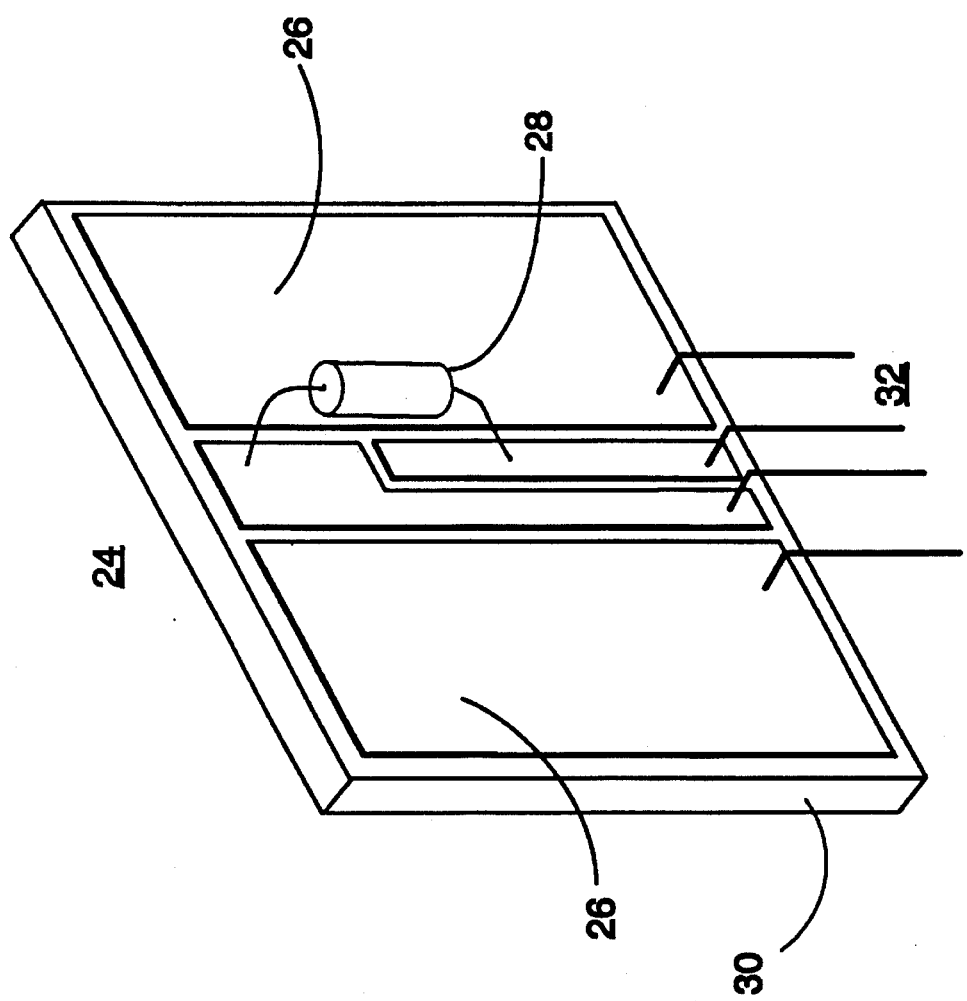
FIG. 4 is a detailed illustration of an alternative embodiment of the present invention.

FIG. 4 illustrates an alternative embodiment of the present invention. Isothermal connector 24 is comprised of the electrical contacts 26, temperature sensor 28, thermally conductive member 30, and wires 32. The electrical contacts 26 and the temperature sensor 28 are thermally coupled to the thermally conductive member 30 which is in the form of a ceramic substrate. The electrical contacts 26 consist of a layer of copper deposited on the surface of the ceramic substrate. The electrical contacts 26 are electrically coupled to the measurement circuit 22 or to the voltage source circuit 34 via the wires 32. Thermally conductive member 30 provides a substantial amount of thermal coupling between each of electrical contacts 26 and between electrical contacts 26 and the temperature sensor 28 to provide an isothermal condition. Temperature sensor 28 may be comprised of a thermistor or a semiconductor junction formed by a transistor or a diode. To achieve further isolation from other sources of thermal energy, thermally conductive member 30 is maintained physically small to facilitate separation from thermal contact with disruptive thermal sources within the temperature instrument 20. The physical dimensions of the alternative embodiment of the isothermal connector 24 are substantially the same as those of the preferred embodiment. The thermal mass necessary to achieve the desired settling time and temperature stability resides in both the electrical contacts 26 and in the thermally conductive member 30. However, unlike the multi-layer printed circuit board of the preferred embodiment, the ceramic substrate has a relatively high thermal mass, allowing the dimensions of the ceramic substrate as well as the volume of copper forming the electrical contacts 26 to be selected to determine the thermal mass of the isothermal connector 24.

Referring now to FIG. 5, there is shown a simplified cut-away illustration of the isothermal connector 24 as installed in the temperature instrument 20. A pair of spring clips 38 provides physical clamping pressure on the corresponding contacts 18 of the thermocouple connector 16, holding the electrical contacts 26 against the corresponding contacts 18 for both electrical and thermal coupling. In the preferred embodiment, the isothermal connector 24 is physically separated from the rest of the temperature instrument 20 and housed within a physical cavity to minimize disruption from other sources of thermal energy within the instrument 20 or from short term changes in ambient air temperature outside the temperature instrument 20.

It will be obvious to those having ordinary skill in the art that many changes may be made in the details of the above described preferred embodiments of the invention without departing from the spirit of the invention in its broader aspects. For example, the electrical contacts 26 may be made of any electrically conductive material and the amount of thermal mass may be varied to obtain desired accuracy and settling times of measurement systems in which thermoelectric junction voltages are of concern. The shape and number of the electrical contacts 26 may be altered to accommodate different connector types which may be either male or female. Therefore, the scope of the present invention should be determined by the following claims.

What I claim as my invention is:

1. A compact isothermal connector for coupling to a thermocouple connector, comprising:
   (a) a multi-layer printed circuit board with at least one thermally conductive layer;
   (b) a plurality of electrical contacts mounted on said multi-layer printed circuit board, said multi-layer printed circuit board providing thermal coupling and electrical isolation between each of said electrical contacts wherein:
   each of said electrical contacts is to be coupled both thermally and electrically to a corresponding contact of said thermocouple connector, and
   each of said electrical contacts has a thermal mass substantially greater than the thermal mass of said corresponding contact; and
   (c) a temperature sensor thermally coupled to said multi-layer printed circuit board for sensing the temperature of said electrical contacts wherein said multi-layer printed circuit board provides thermal coupling between said temperature sensor and each of said electrical contacts.

2. A compact isothermal connector according to claim 1 wherein said multi-layer printed circuit board electrically couples of each of said electrical contacts to a measurement circuit.

3. A compact isothermal connector for coupling to a thermocouple connector, comprising:
   (a) a ceramic substrate;
   (b) a plurality of electrical contacts deposited on the surface of said ceramic substrate, said ceramic substrate providing thermal coupling and electrical isolation between each of said electrical contacts wherein:
   each of said electrical contacts is to be coupled both thermally and electrically to a set of corresponding contacts of a thermocouple connector, and
   said ceramic substrate and said electrical contacts together have a thermal mass substantially greater than the thermal mass of said set of corresponding contacts; and
   (c) a temperature sensor thermally coupled to said ceramic substrate for sensing the temperature of said electrical contacts wherein said ceramic substrate provides thermal coupling between said temperature sensor and each of said electrical contacts.

4. A compact isothermal connector according to claim 3 wherein said ceramic substrate electrically couples of each of said electrical contacts to a measurement circuit.

* * * * *